United States Patent [19]

Takemura

[11] 4,403,193
[45] Sep. 6, 1983

[54] PULSE DETECTION CIRCUIT

[75] Inventor: Takehide Takemura, Hirakata, Japan

[73] Assignee: Matsushita Electric Industrial Co., Ltd., Kadoma, Japan

[21] Appl. No.: 265,322

[22] Filed: May 19, 1981

[51] Int. Cl.³ .................. H03K 5/26; H03D 13/00
[52] U.S. Cl. ............................. 328/109; 328/133; 307/514; 307/247 A
[58] Field of Search ................ 307/514, 247 A; 328/133, 109

[56] References Cited

U.S. PATENT DOCUMENTS

| | | | |
|---|---|---|---|
| 3,430,148 | 2/1969 | Miki | 328/133 |
| 3,588,710 | 6/1971 | Masters | 307/514 |
| 3,646,455 | 2/1972 | Coccagna | 307/514 |
| 4,155,045 | 5/1979 | Forsberg | 328/133 |

Primary Examiner—John S. Heyman

Attorney, Agent, or Firm—Cushman, Darby & Cushman

[57] ABSTRACT

A pulse detection circuit, for detecting pulses contained in output signals derived from an encoder such as rotary encoder which converts any physical quantity like spatial position, displacement or length into an electric signal, is disclosed.

The disclosed pulse detection circuit can minimize the positional error in counting pulses and effectively prevent the accumulation of the erroneous count value by an ingenious establishment and control of the logical relationship among signals by the use of a gate circuit including a plurality of AND gates and an RS flip-flop. It therefore will not erroneously count pulses contained in the encoder output signals even if noise or pulse chatter are incidentally included in the encoder output signals and if the phase relation between the two signals is temporarily inverted, to perform a pulse detection in a very high accuracy.

3 Claims, 15 Drawing Figures

F I G.1
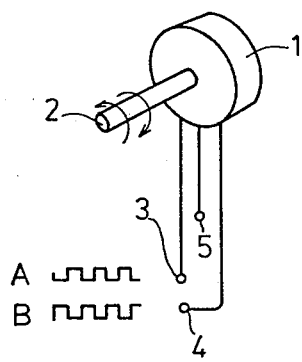
F I G.2
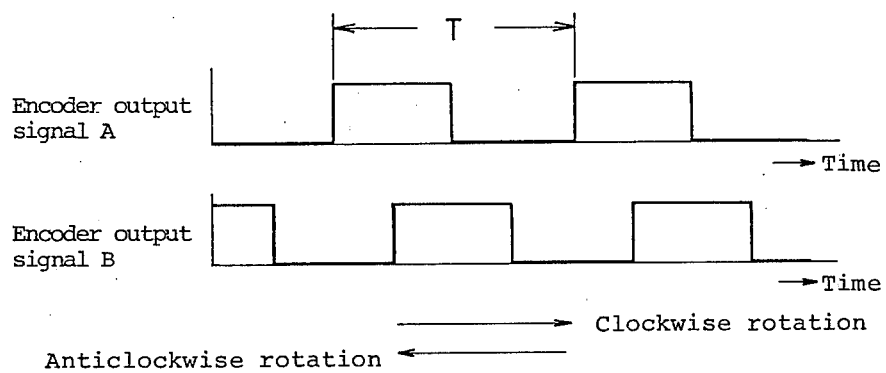

PULSE DETECTION CIRCUIT

BACKGROUND OF THE INVENTION

1. Field of the Invention

The present invention generally relates to the pulse detection technique. Particularly it is concerned with a pulse detection circuit for detecting pulses contained in output signals derived from an encoder such as rotary encoder which coverts any physical quantity like spatial position, displacement or length into an electric signal.

2. Description of the Prior Art

In general, the rotary encoder is embodied to generate output signals A and B of different phase simultaneously in response to the rotation of a shaft 2, being projected from a body 1 thereof as shown by FIG. 1. Numbers of the output pulses of the signals A and B issued from the terminals 3 and 4 of the encoder, respectively, corresponds to the rotational angle of the shaft 2, which is then detected by counting the pulses contained in the output signals A and B. In FIG. 1, numeral 5 represent a common terminal. It is needless to say that the larger the number of pulses per rotation of the shaft 2 contained in the output signal of the rotary encoder, the higher the accuracy of the detection of the rotational angle of the shaft 2 will be.

Namely, any physical quantity is converted into a rotational motion of the shaft 2 of the rotary encoder, which can convert a change in the physical quantity into a change in an electric signal, usually a digital data composed of the pulses. And by counting these pulses by a counter composed of an IC, an accurate measurement of the physical quantity can be made in an easy and simple manner.

Incidentally, the output signals A and B, derived from such the rotary encoder, are usually designed to have pulse sequences of phases being shifted with each other as shown in FIG. 2. By detecting this phase shift, the rotary encoder shown in FIG. 1 can discriminate the rotational direction of the shaft 2 based on a relative phase difference, whether it rotates clockwisely or anti-clockwisely. As a pulse detection circuit for detecting the phase shift between the pulses contained in both of the encoder output signal to discriminate the rotational direction, and for generating a control signal, the following circuits have hitherto been known to the art.

One example of such a conventional circuit includes the use of an up-down counter 6 shown in FIG. 3, wherein one of the encoder output signals is fed to the clock input terminal CP and the other is fed to the up-down input terminal UP/DOWN of the up-down counter 6, respectively. According to this arrangement, the up-down counter 6 counts the leading edge of the pulse contained in the encoder output signal A, which is fed to the clock input terminal CP. Hence the up-down counter becomes "up" state in response to one level, for instance, a high level (hereinafter, simply referred to as "H" level) of the encoder output signal B, which is fed to the up-down input terminal UP/DOWN, while it becomes its "down" state in response to an opposite level, i.e., a low level ("L" level).

As indicated above, if the encoder output signals A and B are fed to the clock input terminal CP and the up-down input terminal UP/DOWN of the up-down counter 6, respectively, the counter 6 counts downwardly by the clockwise rotation of the encoder shaft and counts upwards by the anticlockwise rotation shown in FIG. 2, discriminatively. The cumulated count value of this up-down counter indicates the rotational direction and angle of the encoder shaft.

Another example of the conventional measure includes the use of logic circuit composed of an exclusive OR gate 9, three AND gates 10, 11 and 12, and an inverter 13, shown in FIG. 4. In this logic circuit, the leading edge of the pulse contained in the encoder output signal A is detected by the exclusive OR gate 9 in combination with the AND gate 10 to generate a pulse signal at the output terminal of the AND gate, which output signal is fed to the one input terminals of the AND gates 11 and 12. This output signal therefore causes either of the AND gates 11 and 12 to issue a pulse signal, on the basis of the level in the encoder output signal B at each time when the leading edge of the signal A is detected. Namely, a pulse signal is issued from the AND gate 11, if the encoder output signal B is in its "H" level, whereas the pulse signal is issued from the AND gate 12, if the signal B is in its "L" level. An output terminal 7 of this logic circuit therefore issues an output signal if the encoder shaft rotate anti-clockwisely and another output terminal 8 issues an output signal if the encoder shaft rotate clockwisely.

These output signals are then counted by a conventional counter to give a desired control signal.

Two major disadvantages are, however, inherent to those conventional arrangements, and will be described below.

One of the major disadvantage is a liability of causing an erroneous counting. In general, the encoder as shown in FIG. 1 may be embodied in an optical or mechanical contact system, from which an output signal in an ideal rectangular waveform as depicted in FIG. 2 cannot usually obtained. On the contrary, it cannot avoid an incident of chattering sudden burst of noise (pulse chatter) at or adjacent to leading or trailing edge of the pulse contained in its output signal because of the instability or the like in the contacts at the times of its close or opening. If the chattering noise occurs, erroneously many numbers of pulses would be contained in the encoder output signal, which is to be received by, for instance, the clock input terminal CP of the up-down counter shown in FIG. 3, to cause a count value higher than the actual count.

In order to prevent such an erroneous count due to the chattering, a use of a low pass filter (LPF) comprising an integral circuit composed of a capacitor and a resister has higterto been proposed. The encoder output signal is fed to the detection circuit through the LPF. In a case wherein, the period of the encoder output signal is approximately constant, in the other words, the rotational frequency of the shaft 2 is constant, the above-mentioned means of using a LPF is fairly effective, because the time period during which the chattering occurs (chattering time) is almost constant. However, the length of the chattering time generally depends on the length of the period or pulse duration of the encoder output signal, and hence is usually varying. Therefore, if the LPF is adjusted to effective for an encoder output signal in a state of long period (corresponding to a low rotational frequency of the shaft) by enlarging the time constant of the integral circuit, the response of the detecting circuit will become insufficient when the period is shortened and the circuit itself will be unable to count the pulse properly. Conversely, if the LPF is adjusted to be effective for an encoder output signal in a state of short period (a high rotational frequency), the possibility of the detecting circuit for commiting an erroneous counting will be made greater when the period is elongated, because the LPF cannot absorbe the chattering.

Another major disadvantage of the conventional technique is in a possibility of commiting an erroneous counting at a time of changing the rotational direction of the encoder shaft. This will be elucidated in detail by referring to FIG. 5, wherein the pulse sequences in the encoder output signals A and B are represented by waveforms with respect to relation angles in the first and second lines respectively, while the third line schematically indicates the example of changings of rotational direction of the encoder. When the shaft of the encoder rotates in the direction indicated by arrows, the circuit counts up at point 14 and 15 which correspond to a leading edges of the pulses contained in the encoder output signal A. Next, if the rotational direction of the shaft is changed immediately after passing point 15, the circuit counts down not at point 15' but at point 16 which corresponds to a leading edge with respect to the leftward direction of the pulse contained in the encoder output signal A. Therefore as indicated above, an error represented by "m" in FIG. 5 which is a distance from point 15' to point 16 occurs during the while the detecting circuit counts up at the point 15 and counts down at the point 16 after the change in the rotational direction. Furthermore, if the rotational direction is changed again before passing the point 16 as indicated by an arrow along a broken line in FIG. 5, the detecting circuit counts up again at a point 17 and returning rotation is not represented by the output. Therefore, if such motion of broken line arrows are repeated, a cumalative error value of will be greater.

SUMMARY OF THE INVENTION

It is therefore the primary object of the present invention to provide a pulse detection circuit which obviates the disadvantages inherent to those conventional arrangements.

It is another object of the present invention to provide a pulse detection circuit which will not commit an erroneous counting of pulses contained in the encoder output signals, even if chatterings are incidentally contained in the encoder output signals and if the phase relation between the two signals is temporarily reversed, to perform the pulse detection in a very high accuracy.

According to the present invention, there is provided a pulse detection circuit which comprises; a first and second input terminals, each for receiving either one of encoder output signals containing succession of pulses having different phases with each other; a first and a second leading detectors for detecting the beginning edges of the pulses being fed to said first and second input terminals; a first and a second fall-down detectors for detecting the trailing edges of said pulses; a set/reset flip-flop designed to be brought to its set state by an output signal issued from said first beginning detector on the basis of the signal level at said second input terminal, and to its reset state by an output signal issued from said second beginning detector on the basis of the signal level at said first input terminal; a first output terminal which issues an output signal based on a logical relation among an output signal issued from said first ending detector, the signal level at second input terminal, and the state of said flip-flop; and a second output terminal which issues an output signal based on a logical relation among an output signal from said second ending detector, the signal level at said first input terminal and the state of said flip-flop.

These beginning/ends detectors may be constituted by a gate circuit including a time-delaying element composed of a resistor and a capacitor.

These beginning/ends detectors may alternatively be constituted by a two-stage shift-register, a clock oscillator which feeds a clock signal to said shift register and a gating circuit to which output signals of said shift-register are fed.

BRIEF DESCRIPTION OF THE DRAWINGS

FIG. 1 is a schematic view elucidating a performance of a rotary encoder in general use, FIG. 2 is waveform diagrams of the output signals derived from said encoder.

DESCRIPTION OF THE PREFERRED EMBODIMENT

Figure 6:
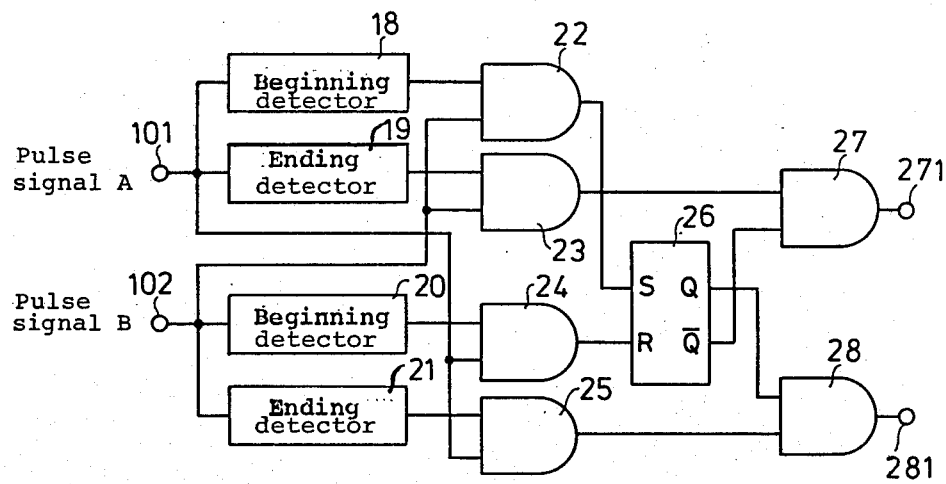
FIG. 6 is a circuit diagram showing a fundamental arrangement of the pulse detection circuit embodying the present invention.

The fundamental arrangement of the pulse detection circuit of the present invention is shown in FIG. 6, wherein numerals 18 and 20 indicate rise-up detectors for detecting beginning (pulse edge going from "L" to "H") in the two encoder output signals A and B respectively, and numerals 19 and 21 indicate ends detectors for detecting ends (pulse edge going from "H" to "L") in the two encoder output signals A and B, respectively. Numerals 22, 23, 24, 25, 27 and 28, each represents an AND gates, while numeral 26 represents a RS flip-flop which is adjusted to be set by an output signal of the AND gate 22, and reset by an output signal of the AND gate 24.

Figure 7:
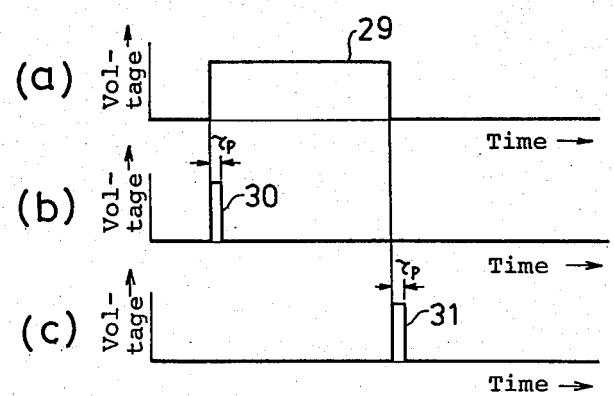
FIGS. 7(a), 7(b), and 7(c) are timing charts for elucidating the performance of a beginning/ends detectors in the circuit shown in FIG. 6.

These rise-up detectors 18 and 20 perform the following functions shown by (a), (b) and (c) in FIG. 7 in combination with the ends detectors 19 and 21. Namely, the rise-up detectors 18 and 20 issue a pulse signal 30 containing a pulse of pulse width $\tau p$ as indicated by waveform (b) in FIG. 7 in response to the beginning of the pulse 29 in an input signal as indicated by waveform (a) in FIG. 7, while the ends detectors 19 and 21 issue a pulse signal 31 containing a pulse of pulse width τp indicated by waveform (c) in FIG. 7 in response to the end of the pulse 29 in the waveform (a).

Next, the function of the arrangement of the pulse detecting circuit shown in FIG. 6 will be described in detail by referring to a timing chart of FIG. 8, wherein numerals suffixed to the character "O" correspond to the numerals in FIG. 6. Therefore, each of the timing charts identified by the O-numeral in FIG. 8 represents the signal occurring at each of the various points indicated by the numerals in FIG. 6.

Figure 8:
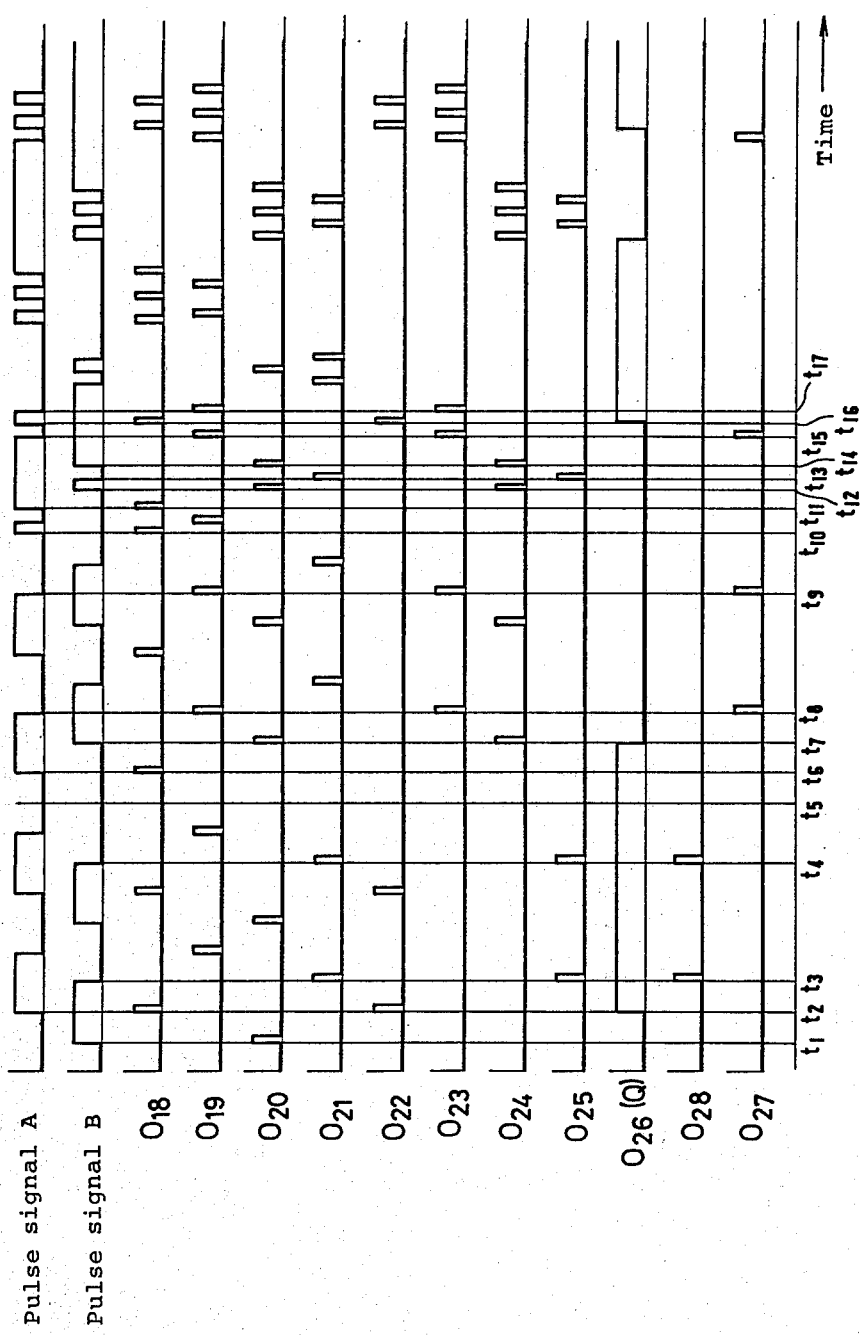
FIG. 8 is a set of timing charts at various parts of the circuit shown in FIG. 6.

When the encoder output signals A and B shown in FIG. 8 are fed to the arrangement of FIG. 6, the rise-up detectors 18 outputs a pulse signal of the timing chart $O_{18}$ containing pulses occurring at the leading edge of the pulse in the encoder output signal A at time $t_2$. At that time, the encoder output signal A is also fed to one input terminal of the AND gate 24, to another input terminal of which is fed an output signal of the rise-up detector 20 that detects the leading edge of the pulse contained in the encoder output signal B. At time $t_1$, no output signal issues from the AND gate 24, because the encoder output signal A is in its "L" level.

Next, when the encoder output signal A rises up at time $t_2$, an output signal issues from the rise-up detector 18 to be fed to one input terminal of the AND gate 22. Therefore, the AND gate 22 issues an output signal of the timing chart $O_{22}$ as indicated in FIG. 8, because the encoder output signal B which is fed to another terminal of the AND gate 22 is in its "H" level at that time. This output signal from the AND gate 22 is fed to the set terminal S of the RS flip-flop 26 to bring it to its "set" state and to make the level of its output terminal "H".

Next, when the encoder output signal B falls down at time $t_3$, thereby an output signal is issued from the ends detector 21 to be fed to one terminal of the AND gate 25, an output signal of the timing chart $O_{25}$ as indicated in FIG. 8 is issued from the AND gate 25, because another input terminal is fed with the encoder output signal A in its "H" level. At that time, a pulse signal indicated in the timing chart $O_{28}$ in FIG. 8 is issued from the output terminal of the AND gate 28, because the output terminal Q of the RS flip-flop 26 is in its "H" level.

As previously described, at every trailing edge of the encoder output signal, for instance at time $t_4$, a pulse signal is issued from the output terminal of the AND gate 28 whereas no output signal is issued from the AND gate 27.

Next, when the rotational direction is reversed at time $t_5$, the phase relation between the encoder output signals A and B in terminal of their pulse sequence is also inverted, and therefore, no change occurs in the output signal of the timing chart $O_{28}$ even when the encoder output signal A begins at time $t_6$, because the encoder output signal B is in its "L" level.

Subsequently, when the encoder output signal B begins at time $t_7$, an input signal is fed to the reset terminal R of the RS flip-flop 26 and its output terminal Q is brought to the "L" level as indicated by the waveform $O_{26}$ in FIG. 8 because the encoder output signal A is in its "H" level.

Next, when the encoder output signal A ends at time $t_8$, an output signal is issued from the AND gate 23 on the basis of the "H" level of the pulse signal B, and the output terminal Q of the RS flip-flop 26 becomes its "H" level because the other output terminal $\overline{Q}$ is in its "L" level (reversal at the output terminal Q), thereby an output signal is issued from the AND gate 27 as in the timing chart $O_{27}$ in FIG. 8. The same situation also occurs at time $t_9$ to issue the output signal.

As previously described, at every trailing edge of the encoder output signal A, a pulse signal is issued from the output terminal of the AND gate whereas no output is made from the AND gate 28. Namely, since an output signal is issued from either one of the AND gate 27 or 28 on the basis of the direction of the delay in the pulse sequence contained in the encoder output signals A and B, a discrimination of the rotational direction can be made possible.

Hereupon, when noise (pulse chatter) is included in the encoder output signal A at time $t_{10}$, a pulse is issued as in the timing chart $O_{18}$ in response to the false beginning, but, nothing occurs because the encoder output signal B is in its "L" level. The same result is obtained with the actual beginning in the encoder output signal A at time $t_{11}$.

Even when the encoder output signal begins at time $t_{12}$ while the encoder output signal A is in its "H" level, the RS flip-foop remains to be unchanged by an input to its reset terminal R because it has already been reset. Subsequently, when the encoder output signal B ends at time $t_{13}$ and an output signal is issued from the AND gate 25, no output signal is issued from the AND gate 28 because the output terminal Q of the RS flip-flop is in its "L" level. Furthermore, even when the encoder output signal B begins again at time $t_{14}$, nothing occurs, as in the case at time $t_{12}$.

Next, when the encoder output signal A ends at time $t_{15}$ while the encoder output signal B is in its "H" level, a pulse signal is issued from the output terminal of the AND gate 27 because the output terminal $\overline{Q}$ of the RS flip-flop 26 is in its "H" level. And, when another chattering noise appears in the encoder output signal A again at time $t_{16}$ while the encoder output signal B is in its "H" level, an input signal is fed to the set terminal S of the RS flip-flop 26 to set it. However, when the chattering noise disappears in the encoder output signal A at time $t_{17}$ while the encoder output signal B is in its "H" level, and output signal is issued from the AND gate 23, but, since the output terminal $\overline{Q}$ of the RS flip-flop is in its "L" level, no output signal is issued from the AND gate 27.

As previously described, even if a large amount of pulse chatter or noise is included in both of the encoder output signals A and B, only one output pulse signal, which accurately corresponds to each trailing edge of the pulse contained in either one of the encoder output signals A and B, is issued at either one of the output terminals 271 or 272 to cause no miscounting of the pulse in the encoder output signals.

Figure 9:
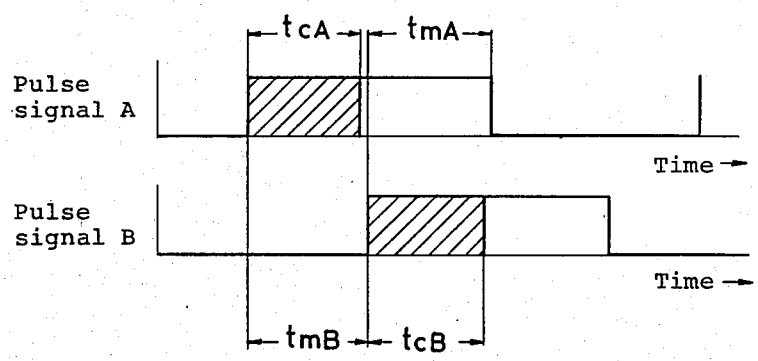
FIG. 9 is a schematic view of elucidating relation between the chattering time and the pulse duration in FIG. 6, FIGS. 10 and 11 are schematic views for elucidating the advantages of the circuit shown in FIG. 6.

In order that the pulse detection circuit of the present invention might properly function as previously described, the following conditions illustrated by FIG. 9 should be satisfied. Namely;

$$t_{cA} < t_{mB}$$

wherein, $t_cA$ represents a time period during which a chattering noise may be included in the encoder output signal A, and $t_{mB}$ respresents a time period beginning with the start of the time period $t_{cA}$ and ending at the leading edge of the next pulse in the encoder output signal B. And;

$$t_{cB} < t_{mA}$$

wherein, $t_{cB}$ represents a time period during which a chattering noise may be included in the encoder output signal B, and $t_{mA}$ represents a time period beginning with the start of the time period $t_{cB}$ and ending at the trailing edge of the pulse in the encoder output signal A. Otherwise, the arrangement may commit as a malfunction, an erroneous counting.

If the phase relation is inverted between the encoder output signals A and B, the malfunction caused by the chattering noise can likewise be prevented by fulfiling the previously defined conditions when the encoder output signal A in FIG. 9 is taken as an encoder output signal B and the encoder output signal B is taken as an encoder output signal A.

In the following description, an elucidation will be made on the advantage of the pulse detection circuit embodying the present invention that it will not miscount the number of pulses at the time of changing the rotational direction of the encoder shaft, namely, at the time of inversing the phase relation in the pulse sequence between the encoder output signals A and B.

Figure 10:
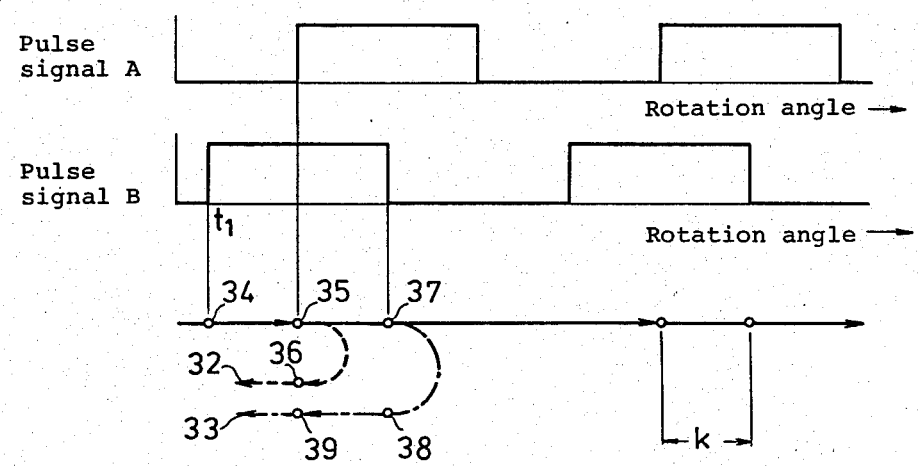

In FIG. 10, the pulse sequences in the encoder output signals A and B are represented by waveform charts in the first and second line while the third line schematically indicates the rotational direction of the encoder as extended along the time axis. At a point 34 along the axis which corresponds to time $t_1$ in FIG. 8, no output is issued from either of the AND gate 22 or 24 to cause no change by the beginning of encoder output signal B, but the RS flip-flop 26 is set at a point 35. Next, if the rotational direction of the encoder is changed before the trailing edge of the pulse contained in the encoder output signal B comes as a broken line arrow 32 in FIG. 10, then the encoder output signal A ends at a point 36 while the encoder output signal is in its "H" level. No output is however issued from the AND gate 27 because the RS flip-flop 26 remains to be set. In short, nothing occurs in the case of changing the rotational direction of the encoder as indicated by an arrow 32.

Next, if the rotational direction of the encoder is changed after the encoder output signal B ends at a point 37, which corresponds to time $t_3$ in FIG. 8 as indicated by a chain line arrow 33 in FIG. 10, then an output signal is issued from the AND gate 28. Suppose it is taken to be "+1" by a counter of the following stage. Hereupon, the encoder output signal B begins at a point 38 after the change in the rotational direction, while the encoder output signal A is in its "H" level and the RS flip-flop 26 remains to be reset, and then an output signal "−1" is issued from the AND gate 27 as in the case of time $t_8$ of FIG. 8. Suppose it is taken as "−1" (by the counter of the following stage), then the situation resumes to its initial condition, because the previous "+1" value is offset by the "−1" value.

Figure 3:
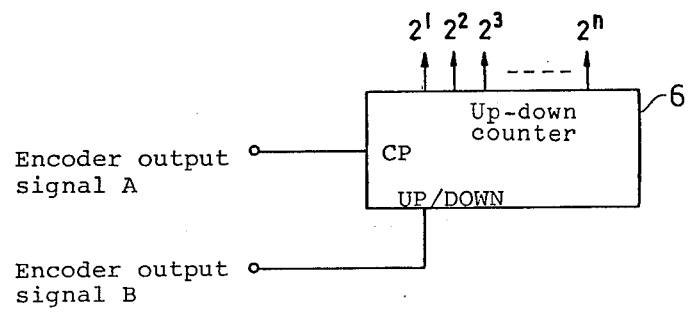
FIG. 3 is a circuit diagram showing a conventional pulse detection circuit.
Figure 4:
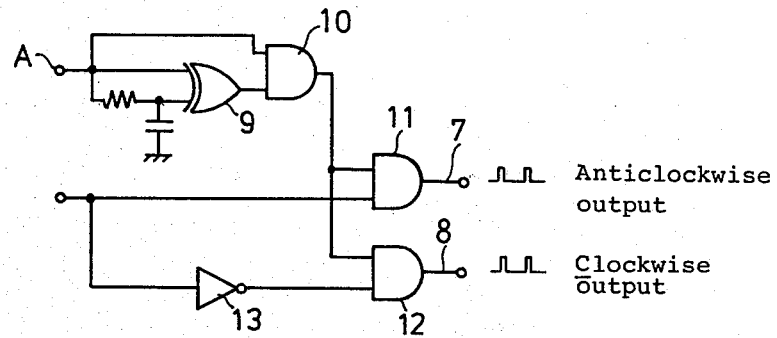
FIG. 4 is a circuit diagram showing another conventional pulse detection circuit.
Figure 5:
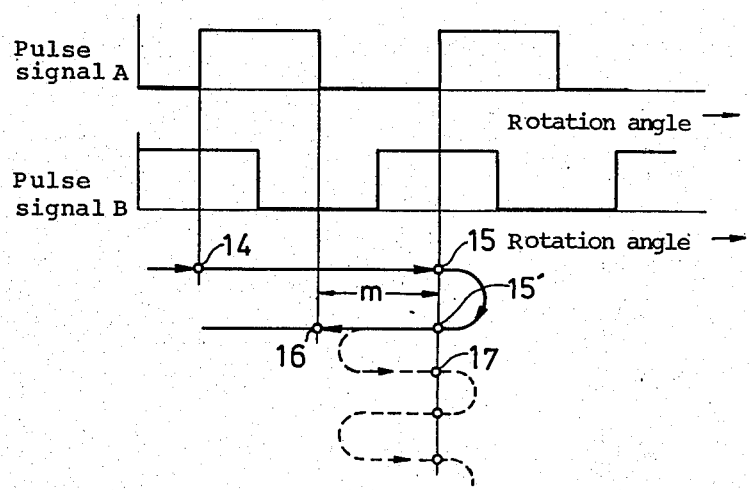
FIG. 5 is a schematic view for illustrating the disadvantages of the circuit shown in FIG. 4.

As can be seen from the above disclosure as regards the performance of the detection circuit of the present invention, the positional error in counting is represented by "k" in FIG. 10 and smaller than "m" in FIG. 5. As is obvious from FIG. 10, since the angle "k" can be made sufficiently smaller than "m," the errors which are liable at changes of rotational direction within a small angle rotation can be eliminated, and hence, accumulation of the error value, which had been inherent to the conventional arrangements, is successfully avoided.

Figure 11:
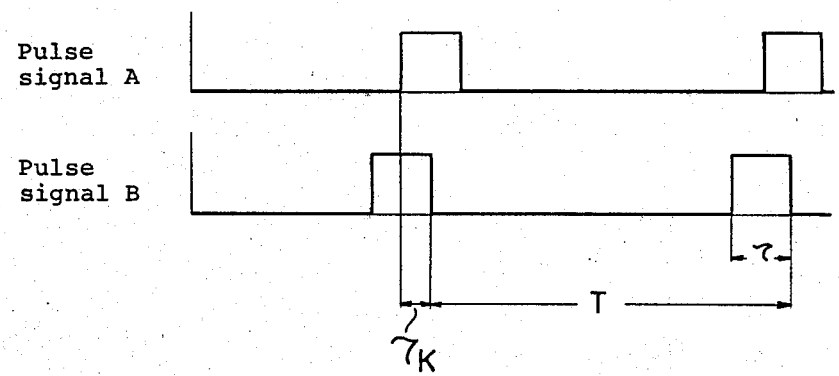

The value "k" in FIG. 10 can theoretically be made smaller and smaller without any limitation. That is, the pulse width $\tau$ can be designed to be much smaller than the period T in the encoder output signal, so that the time period $\tau k$, which is corresponding to the value "k," can be made very small as shown in FIG. 11. In contrast to this, according to the conventional technique illustrated in FIG. 5, the value "m" corresponds to the value T-$\tau$ shown in FIG. 11, and therefore a large error remains in the conventional apparatus, and the error cannot be made smaller than T/2 in theory.

FIGS. 12 through 15 inclusive show concrete circuit arrangements of the beginning and ending detectors which may be included in the pulse detection circuit embodying the present invention and will be elucidated in detail below.

Figure 12:
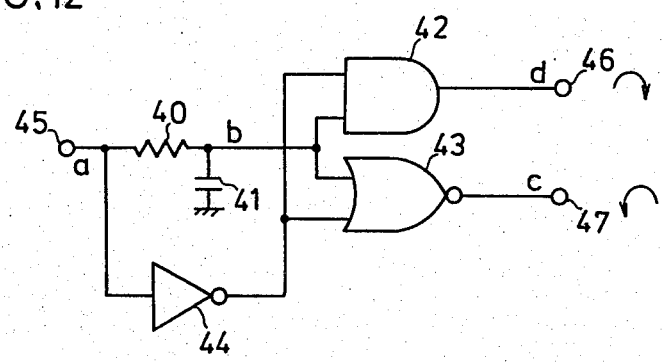
FIG. 12 is a circuit diagram showing a concrete embodiment of the beginning/ends detector of the pulse detection circuit embodying the present invention.

In an embodiment shown in FIG. 12, the detector comprises a time-delaying element composed of a resister 40 and a capacitor 41, an AND gate 42, a NOR gate 43 and a i-verter 44. A pulse signal is issued from the output terminal 46 in response to a trailing edge of a pulse fed to an input terminal 45 and another pulse signal is issued from the output terminal 47 in response to a leading edge of the pulse fed to the input terminal 45, respectively.

Figure 13:
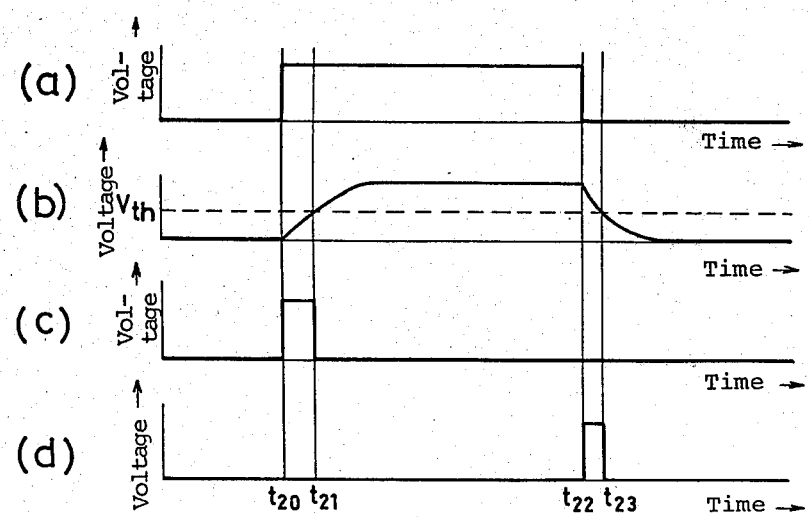
FIGS. 13(a)–13(d) are timing charts showing waveforms of the signals appeared at parts a–d of the circuit shown in FIG. 12, respectively.

In FIG. 13, there are shown timing charts of signals appeared at various points of the circuit shown in FIG. 12, and each of the charts (a), (b), (c) and (d) corresponds to each of the signals present at the points a, b, c and d of the circuit, respectively. In FIG. 13, when the encoder signal (a) begins at time $t_{20}$, the output (d) an output terminal 46 of the AND gate 42 remains to be in its "L" level because the output of the inverter 44 is in its "L" level, whereas the output (c) at output terminal 47 of the NOR gate 43 becomes to be in its "H" level because the output of the inverter 44 is in its "L" level and the voltage (b) across the capacitor 41 rises (b) with delay. But the output (c) of the NOR gate 43 becomes to be its "L" level at time $t_{21}$ when the voltage across the capacitor 41 is detected to exceed the threshold level (broken line X of FIG. 13). Next, when the encoder signal (a) fed to the input terminal 45 ends at time $t_{22}$, the output of the inverter 44 becomes its "H" level. The output (c) at the terminal 47 of the NOR gate 43 remains to be "L" while the output (d) of the AND gate 42 becomes its "H" level because the voltage (b) across the capacitor 41 remains to be "H." But the output of the AND gate 42 (d) becomes to be its "L" level, when the voltage across the capacitor 41 lowers below the threshold level $V_{th}$ at time $t_{23}$.

As above-mentioned, in response to the leading and trailing edges of the pulse appeared at the input terminal 45, the output pulses of this circuit are obtained. And the widthes of the output pulses can be adjusted by varying the value of the resistor 40 and the capacitor 41.

Another embodiment of the beginning/ending detector constituted with flip-flop circuits is shown in FIG. 13. The example of the detector shown in FIG. 14, comprises two stage D flip-flops 49 and 50 having an input terminal 48, two AND gates 51 and 52, and a clock oscillator 53, wherein the D-flip-flops 49 and 50 constitute a shift register by being fed a common clock signal at their clock input terminals CL.

Figure 14:
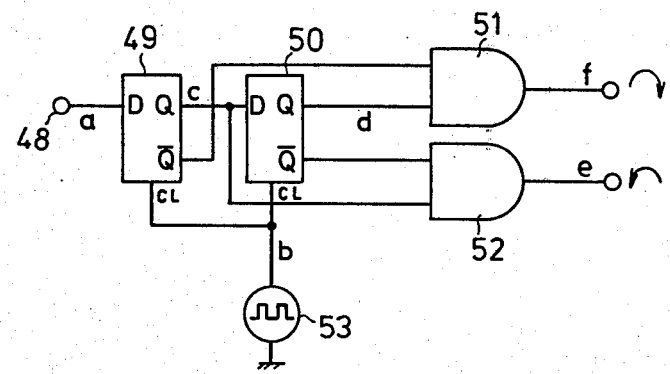
FIG. 14 is a circuit diagram showing another concrete embodiment of the beginning/ends detector.
Figure 15:
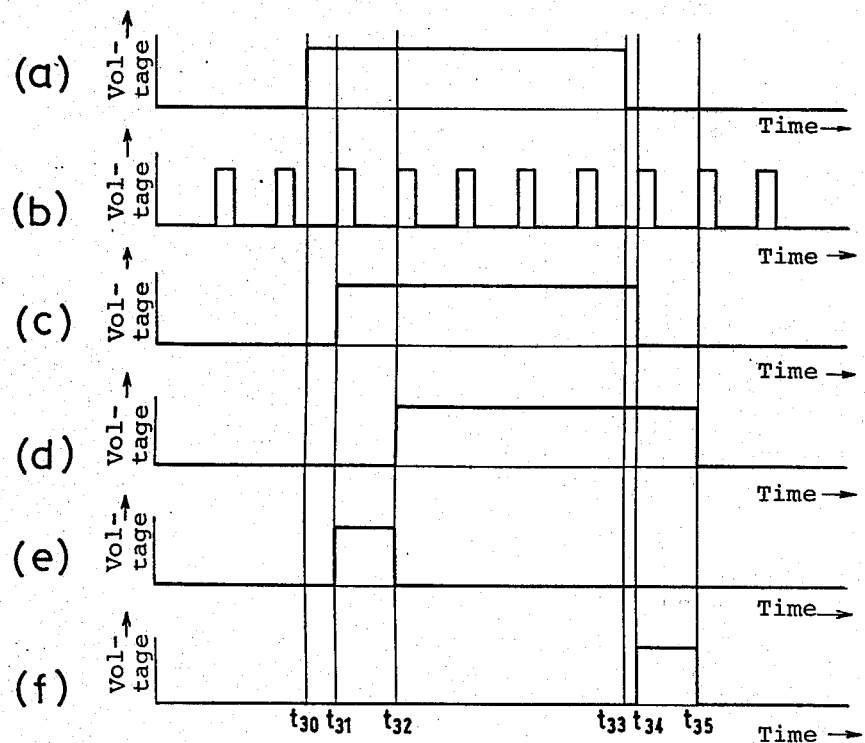
FIGS. 15(a)–15(f) are timing charts, representing waveforms of the signals appeared at parts a–f of the circuit shown in FIG. 14, respectively.

In FIG. 15, there are shown timing charts of signals at various points of the circuit shown in FIG. 14, and each of the charts (a), (b), (c), (d), (e) and (f) corresponds to each of the signals present at the points a, b, c, d, e and f of the circuit, respectively. A clock signal of a given frequency is issued from the clock oscillator 53.

After the encoder signal fed to the input terminal 48 (a) has begun at time $t_{30}$, the output terminal Q (c) of the D-flip-flop 49 becomes its "H" level in response to the leading edge of the clock signal (b) appeared at time $t_{31}$. Simultaneously, the output (e) of the AND gate 52 becomes its "H" level, because the output terminal Q of the D-flip-flop 50 is in its "H" whereas that Q of the D-flip-flop 50 is in its "L" level at that time.

In response to the next leading edge of the clock signal (b) appeared at time $t_{32}$, the data carried by the D-flip-flop 49 are shifted to the D-flip-flop 50 and the output (d) of the output terminal Q of the D-flip-flop 50 becomes its "H" level to make the output of the AND gate 52 "L". And, after the encoder signal (a) fed to the input terminal 48 has ended at time $t_{33}$, the output terminal Q of the D-flip-flop 49 becomes its "L" level and the output terminal Q thereof becomes its "H" level in response to the leading edge of the clock signal (b) appeared at time $t_{34}$, to make the output of the AND gate 51 "H."

Next, the data carried by the D-flip-flop 49 are shifted to the D-flip-flop 50, in response to the subsequent leading edge of the clock signal (b) appeared at time $t_{35}$, to make the output of the AND gate 51 "L."

As described above, in response to the leading and trailing edges of the pulses appeared at the input terminal 48, the output pulses of this circuit are obtained. And the widths of the output pulses can be determined by the frequency of the clock oscillator 53. Namely, the output pulses in synchronism with the clock signal are obtained from this circuit.

What is claimed is:

1. A pulse detection circuit which comprises;

first and second input terminals, each for receiving either one of encoder output signals containing a succession of pulses being shifted in phase with each other;

first and second beginning detectors for detecting the leading edges of the pulses received by said first and second input terminals;

first and second ending detectors for detecting the trailing edges of said pulses;

a set-reset flip-flop connected to said beginning detectors for being set to its set state by an output signal received from said first beginning detector on the basis of the signal level at said second input terminal, and reset to its reset state by an output signal received from said second beginning detector on the basis of the signal level at said first input terminal;

means including a first output terminal for producing an output signal based on a logical relation among an output signal produced by said first ending detector, the signal level at said second input terminal and the state of said flip-flop; and means including a second output terminal for producing an output signal based on a logical relation among an output signal produced by said second ending detector, the signal level at said first input terminal and the state of said flip-flop.

2. A pulse detection circuit as claimed in claim 1, wherein each combination of said first beginning and ending detectors, and of said second beginning and ending detectors, is constituted by a gate circuit including a time-delaying element composed of a resistor and a capacitor.

3. A pulse detection circuit as claimed in claim 1, wherein each combination of said first beginning and ending detectors, and of said second beginning and ending detectors, is constituted by a two-stage shift-register, a clock oscillator which feeds a clock signal to said shift-register and a gate circuit to which output signals of said shift-register are fed.

* * * * *